United States Patent [19]

Strelow

[11] 4,149,069

[45] Apr. 10, 1979

[54] SAFETY CIRCUIT FOR A DATA PROCESSING SYSTEM PRODUCING BINARY SIGNALS

[75] Inventor: Horst Strelow, Brunswick, Fed. Rep. of Germany

[73] Assignee: Siemens Aktiengesellschaft, Berlin & Munich, Fed. Rep. of Germany

[21] Appl. No.: 834,155

[22] Filed: Sep. 19, 1977

[30] Foreign Application Priority Data

Nov. 10, 1976 [DE] Fed. Rep. of Germany ....... 2651314

[51] Int. Cl.$^2$ ............................................. G06F 11/08
[52] U.S. Cl. ................................... 235/307; 307/219; 340/146.1 BE
[58] Field of Search .............. 340/146.1 BE; 235/307; 307/219

[56] References Cited

U.S. PATENT DOCUMENTS

| | | |
|---|---|---|
| 3,509,532 | 4/1970 | Vande Wege .............. 340/146.1 BE |
| 3,517,174 | 6/1970 | Ossfeldt ................................ 235/307 |
| 3,810,119 | 5/1974 | Zieve et al. ......................... 235/307 |
| 3,978,327 | 8/1976 | Huber .................................... 235/307 |
| 4,012,717 | 3/1977 | Censier et al. ...................... 235/307 |
| 4,030,074 | 6/1977 | Giorcelli ............................. 235/307 |

FOREIGN PATENT DOCUMENTS 2113546 10/1972 Fed. Rep. of Germany.

*Primary Examiner*—Charles E. Atkinson
*Attorney, Agent, or Firm*—Hill, Gross, Simpson, Van Santen, Steadman, Chiara & Simpson

[57] ABSTRACT

The invention relates to a safety circuit for a data processing system comprising two micro computers which operate in a redundant fashion receiving similar inputs and having similar output lines conveying coincident or corresponding signals during proper operation which are indirectly connected to a common push-pull amplifier. A transformer is connected in circuit with the push-pull amplifier and a conversion circuit constructed from the flip-flop trigger elements produces a pair of signals for operating the push-pull amplifier when the signal pair logic 1 exists. When the signal pair of logic 0 exists, the push-pull amplifier does not operate. The conversion circuit operates in connection with a clock pulse current supply for the two micro computers so that in the case of malfunction, no clock pulses are produced.

5 Claims, 1 Drawing Figure

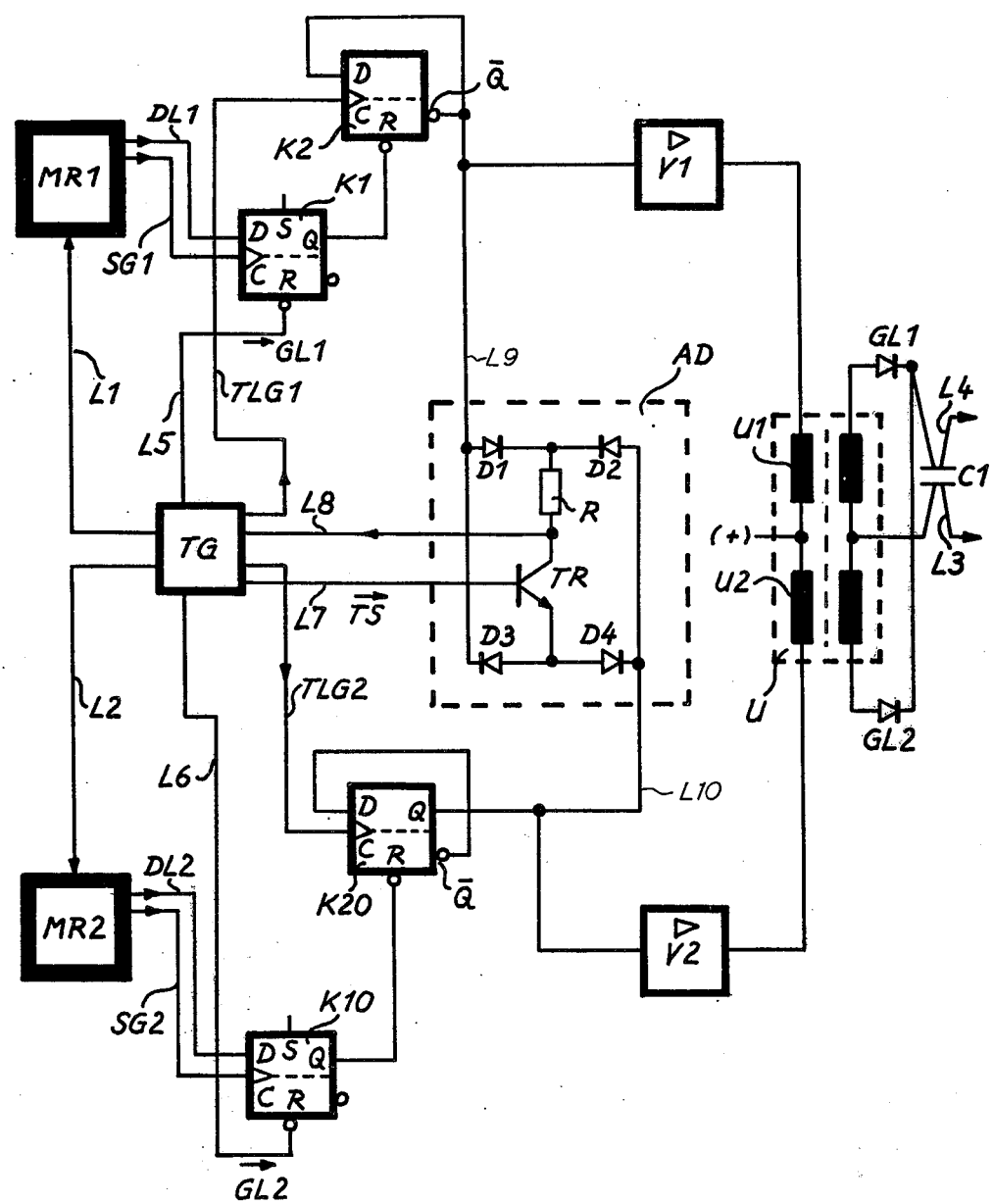

SAFETY CIRCUIT FOR A DATA PROCESSING SYSTEM PRODUCING BINARY SIGNALS

BACKGROUND OF THE INVENTION

1. Field of the Invention

The invention relates in general to a safety circuit for a data processing system emitting binary signals employing an amplifier including an output transformer which has a secondary winding connected to a controlled element to supply fail safe signals through a rectifier circuit.

2. Description of the Prior Art

In many technical fields, electronic installations are increasingly used for the purpose of controlling automated operational cycles. Included in this category for example, are those installations which have become conventional and use process control computers and micro computers. In the field of railway safety engineering, special switching devices or sequential circuits are used with specific logic circuits which are constructed from passive and active elements such that proper functioning of these elements is required to assure the safety of the railway traffic. However, since it is inevitable that certain types of defects will occur with components, that logic circuits are generally constructed such that for the purpose of railway safety engineering errors in the components at the most have an operational impeding effect and cannot produce an effect which endangers the operation of the vehicles, for example. The result is that in utilizing modern data processing systems whose systems are not constructed according to the above given safety engineering criteria such data processing systems cannot readily be used in technical fields where the safety reliability is required as in the case of railway operating systems. This also applies uniformly in every instance where processes, in the event of a malfunction of the controlling installation must be transferred into a state which is non-dangerous to human beings and machines.

Several examples will be given to clarify this principle. Control devices in nuclear medicine under certain circumstances must be controlled so that irradiation will be interrupted.

In the operation of passenger cars, a safe radar controlled distance warning system or a safe control for a skid-free braking system can be constructed such that a defect which has occurred makes itself known to the driver before the error causes a malfunction which is hazardous to the driver's safety.

Also, in traffic light control systems, large chemical processes, street roller control systems generating plant control systems and in monitoring nuclear reactor system fail safe control is required.

For the technically safe output of binary signals from an electronic switching mechanism, generally alternating voltage amplifiers are utilized which deliver their energy for the purpose of controlling random consumer elements as, for example, relays through a transformer and a rectifier circuit which is fed by the transformer. Circuits of this type have the advantage in that random defects particularly short circuits in the switching path of an amplifier transistor always produce a reduction in the output voltage and the circuit must never produce an output voltage which connects the control relay to a signal so as to cause a false signal or non-desired process or feedback control. The output circuits given as examples here must be utilized according to the principles of safety engineering such that with the value of 0 their output voltage is put in a safe condition wherein the operational controlled element cannot be energized.

SUMMARY OF THE INVENTION

It is an object of the present invention to produce a safety output circuit for a dual computer system which consists of conventional micro computers which process clock pulse synchronous corresponding data.

According to the invention, this object is achieved by the use of the following features; a pair of data lines which convey similar binary signals from a pair of two micro computers controlled in a pulse synchronous fashion by common clock pulse current supply is connected with each of the data lines connected to first D flip flop trigger elements which function as output modules and which have their outputs connected to the reset inputs of second trigger circuit elements. Synchronous clock pulses from the clock pulse current supply are provided for the two second D flip flop trigger circuit elements. A reset input of one or the other first trigger circuit element is connected to an output of the clock pulse current supply and the output of the first trigger supply is supplied to the reset of the second trigger circuit element. The output of one of the second trigger circuit elements and the negative output of the other second trigger circuit element are connected to a monitoring signal device including a transistor which receives an interrogating signal from the clock pulse current supply and produces an output trigger signal to the clock pulse current supply when its input indicates safe operating outputs from both of the computers.

Utilizing the safety circuit of the present invention allows pair connection of two data lines having the same binary signals such that in the case of an error, it is assured in a simple manner that a deviation of one of the binary signals which should be similar during proper operation will prevent further operation of the output device. The cost of the present invention is minimal for each of the output channels and the safety device of the invention requires the use of only conventional passive or active elements.

A particular advantage of the safety output circuit of the present invention is that only a short time is required to disclose and recognize that a defect exists and this disclosure time is independent of the data flow rate.

In the case of output of binary signals having the logic value 1 in order to further abbreviate the defect disclosure time short signal switching over processes can be provided in regular intervals per program by the micro computers so that the logic value 0 is emitted for the duration of several micro seconds. These short signal switch over processes provide for test purposes and do not result in switching off of the consumer units due to the delay properties in the circuits. Thus, relays do not drop out and signals do not change during these test times. If, due to a defect one of the trigger circuit elements is no longer capable of switching or connecting and this automatically results in a safety switch-off.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

BRIEF DESCRIPTION OF THE DRAWING

The drawing is a block diagram of the safety circuit of the invention.

DESCRIPTION OF THE PREFERRED EMBODIMENTS

The Figure illustrates a pair of micro computers MR1 and MR2 which for safety reasons process the same data or information in a clock-pulse synchronous fashion. It is to be realized that both of the computers receive the same inputs on input lines but for clarity these input lines are not illustrated. In the sample embodiment many different types of installations can be controlled by the output signals of the micro computers and in the present invention the micro computers need not be constructed in a fail safe manner.

A common clock pulse current supply TG is connected by lines L1 and L2 to the micro computers MR1 and MR2 to provide clock pulse synchronous control. Output data lines DL1 and DL2 are respectively connected to the computers and binary signals are produced by the computer and supplied to such lines having the values of 0 or 1. As a practical matter the computers may have many output lines but for purposes of illustration of the invention only a single output line DL1 and DL2 is illustrated as outputs of the two computers. The input lines to the computers are not illustrated but would be conventional in form. When proper operation exists, logic values 1 will appear on the lines DL1 and DL2. The signals on lines DL1 and DL2 indirectly control a push-pull amplifier arrangement consisting of two amplifiers V1 and V2 and including an output transformer U which is connected to output lines L3 and L4 through a rectifier circuit including diodes GL1 and GL2 and a capacitor C1. A relay or other output device may be connected across the lines L3 and L4 such that when signals of logic value 1 appear on lines DL1 and DL2 the relay will be energized to energize a controlled circuit connected to the energizing circuit of the relay connected to lines L3 and L4.

A D flip flop trigger circuit element K1 has its D input connected to output line DL1 of micro computer MR1. A D flip flop circuit K10 has its D input connected to line DL2 of micro computer MR2. The clock pulse inputs C of D flip flop trigger circuit elements K1 and K10, respectively, are connected to the micro computers MR1 and MR2, respectively, through control signal lines SG1 and SG2, respectively. The lines DL1 and SG1 and DL2 and SG2, respectively, are connected to the respective bus lines of the associated micro computers MR1 and MR2. The reset terminal R of D flip flop trigger circuit element K1 is connected to the clock pulse current supply DG by way of line L5. The reset input R of trigger circuit K10 is connected to the clock pulse current supply TG through line L6. The clock pulse current supply TG resets the circuits K1 and K10 with the value logic 0 in a time synchronous manner so as to reset the D trigger circuit elements K1 and K10.

The Q output of D trigger circuit element K1 is connected to the reset input terminal R of a third D flip flop trigger circuit element K2. The output $\bar{Q}$ of trigger circuit K10 is connected to the reset input R of a fourth D flip flop trigger circuit element K20 as shown. These outputs reset the circuit elements K2 and K20, respectively. The negated outputs $\bar{Q}$ of the two D trigger circuit elements K2 and K20 produce a signal having logic value 1. The negated $\bar{Q}$ output of D trigger circuit element K2 is connected to the D input of circuit K2. The negated output Q of circuit K20 is connected to its D input. So as to provide edge control the pulse input C of D trigger element K2 is connected to the signal clock pulse generator supply DG by way of pulse line TLG1. The C input of circuit K20 is connected by line TLG2 to the clock pulse current supply TG. The two D trigger circuit elements K2 and K20 will be continuously operated or actuated in a clock pulse synchronous fashion during proper operation of the computer.

Also, the amplifier V1 has its input side connected to the negated ouput $\bar{Q}$ of the D trigger circuit element K2. A second amplifier V2 is connected to the Q output of D trigger circuit element K20. Thus, during proper operation, assuming the output of binary signals of the value logic 1 on data lines DL1 and DL2 from the computers MR1 and MR2, static non-equivalent signals will be connected to the inputs of both amplifiers V1 and V2. During the output of one binary signal in each instance of the value logic 1 from the data lines DL1 and DL2 dynamic non-equivalent signals in the form of two square wave voltages which are mutually phase-displaced by 180° will be present at the inputs of the amplifiers V1 and V2. These signals can be processed by the push-pull amplifier to output signals on the lines L3 and L4.

A non-equivalent monitoring circuit AD is connected to the $\bar{Q}$ output of trigger circuit K2 and to the Q output of trigger circuit K20. Circuit AD is constructed such that it samples and reports statically non-equivalent signals as well as dynamically non-equivalent signals (direct voltage square wave voltage). The non-equivalent monitoring circuit AD consists of a switching transistor TR which has its collector connected to one side of a resistor R which has its other side connected to the junction points between two diodes D1 and D2 of a bridge rectifier arrangement D1, D2, D3 and D4. The emitter of transistor TR is connected to the junction points between diodes D3 and D4. The $\bar{Q}$ output line of trigger circuit K2 is connected to the diodes D1 and D3 and the Q output of circuit K20 is connected to the junction points of diodes D2 and D4. The diodes are poled as shown. The non-equivalent monitoring circuit AD is supplied a supply voltage only in those instances in which both of the D trigger circuit elements K2 and K20 are both equally statically free of interference and in the same switching position or if they are operating dynamically and manifest the same change of state. The base of the switching transistor TR receives through line L7 test pulses TS from the clock pulse current supply TG for the purpose of interrogating the non-equivalent monitoring element AD. Only in the case of a non-equivalency are the supplied test pulses TS returned through line L8 to the clock pulse current supply TG and when such signals are returned on line L8 the clock pulse current supply TG will produce control signals on lines L1, L2, TLG1, TLG2, L5 and L6 until the time of arrival of the next pulse TS. Thus, it is seen for the transistor TR to be energized so as to return a signal on line L8 the signals on lines L9 and L10 must be different. That is to say, that when the signal on line L9 is negative the signal on line L10 must be positive so as to cause the transistor TR to conduct.

Generally, of course, a plurality of data lines will be providing output from the micro computers MR1 and MR2 but in the drawing only a single data line DL1 and DL2 is illustrated but it is evident that in practice a large number of non-equivalent monitoring elements can be respectively connected to the associated additional lines from the two computers. In such event, the line L8 is not directly connected to the clock pulse current supply TG but is supplied to an additional non-equivalency monitoring element and the non-equivalent monitoring elements are connected to form a series arrangement whereby the last non-equivalent monitoring element in the serie chain is connected to the pulse current supply TG.

In the case of the reset signals GL1 and/or GL2 having the value logic 0 supplied through lines L5 and L6 to the trigger circuit elements K1 and K10 they will be reset to a corresponding initial switching position which is important in terms of starting the safety output circuit. In the initial switching position, both D trigger circuit elements K1 and K10 produce a signal having the value logic 0 at the respective $\bar{Q}$ outputs to the respective reset inputs R of the associated output connected D trigger circuit elements K2 and K20, respectively. This causes the two D trigger circuit elements K2 and K20 to be reset to the reset switching state where they will remain. At the same time, the output $\bar{Q}$ of D trigger circuit element K2 produces a signal logic 1 and the output Q of the D trigger circuit element K2 produces the signal logic 0. These signals are supplied to lines L9 and L10, respectively. Since the amplifiers V1 and V2 have not received any dynamic control signals the voltage at the output lines L3 and L4 will remain at 0 as it has previously been.

After the first test pulse signal TS has been returned from the non-equivalent monitoring element AD due to the fact that the signals on lines L9 and L10 have different values, the switching on phase is terminated with the cessation of the reset signals GL1 and GL2. If signals of the value logic 0 are now emitted from the micro computers MR1 and MR2 on their data lines DL1 and DL2 there will be no change in the switching state of the D trigger circuit elements K1 and K2 or K10 and K20.

If, however, the data lines DL1 and DL2 have binary signals of the value logic 1, this will cause the associated D trigger circuit elements K1 and K10 to respectively, assume the logic value 1 at their Q outputs. The respective Q outputs of D trigger circuit elements K1 and K10 then supplies the value logic 1 to the D trigger circuit elements K2 and K20 to cause their outputs to take an actuating state. This causes the value logic 1 appearing at the time of the respective output Q of the trigger circuit elements K2 and K20 to exist in a clock-pulse control fashion controlled by the $\bar{D}$ inputs. Subsequently, the respective $\bar{Q}$ output of the D trigger circuit elements K2 and K20 will carry the value logic 0. During the next clock pulse delivered by way of pulse lines TLG1 and TLG2, respectively, the D inputs of the trigger circuit elements K2 and K20, respectively, will assume the value logic 0 at the associated Q outputs. It can be seen that both the D trigger circuit elements K2 and K20 constantly switch back and forth between the two possible switching states or condition when there is a proper pulse supply. The amplifiers V1 and V2 thereby receive dynamic non-equivalent signals, in other words, square wave voltages which are necessary for the operation of the push-pull amplifier. As a consequence, the voltage associated with binary signal logic 1 on data lines DL1 and DL2 will cause the switching of the relay not illustrated connected to lines L3 and L4. The lines L3 and L4, of course, will not be coupled to the output of the amplifiers V1 and V2 if an AC output does not exist at the outputs of these amplifiers because the transformer U couples signals to the output only with an AC input.

As soon as the binary signal value logic 0 appears on both data lines DL1 and DL2 instead of the binary signal having a value logic 1, the D trigger circuit elements K2 and K20 will be reset with the output of the associated D trigger circuit elements K1 and K10, respectively, and they will remain in this static switching position. Under these conditions, the push-pull amplifiers V1 and V2 will be inoperative so that there will be no voltage on lines L3 and L4. Due to the still present static non-equivalent signals on the non-equivalent monitoring element AD the transistor TR will remain conducting for the test pulses TS so that the pulse current supply TG will continue to produce output signals.

The invention may be connected in a variety of ways beyond that described in the sample embodiment.

Instead of the D trigger circuits K1, K2, K10 and K20 other types of trigger circuit elements may be utilized which produce the same function.

The reset or basic position signals GL1 or GL2, respectively, can also be supplied in the form of a binary signal having the value of logic 1 to the respective set input terminals S of the trigger circuit elements K1 or K10, respectively. In this instance, the connections of the reset inputs R of the trigger circuit elements K1 and K10 are eliminated and the output $\bar{Q}$ will be employed instead of the respective output Q.

Additionally, the sample embodiment can also be operated with only a single amplifier V1 or V2. In this case, the primary winding U1 or U2 respectively, of the output transformer U can be eliminated.

In another embodiment, the amplifiers V1 and V2 are not electrically connected with one trigger circuit element K2 or K20 but they are connected only with the one or the other trigger circuit element K2 or K20 respectively, through a transformer.

Although it has been described with respect to preferred embodiments it is not to be so limited as changes and modifications can be made therein which are within the full intended scope as defined by the appended claims.

I claim as my invention:

1. A safety circuit for a clock actuated read-out from a data processing system wherein the safety circuit includes an amplifier means, an output transformer with its primary connected to the output of said amplifier, a rectifier connected to the secondary of said transformer, output means supplied from said rectifier wherein the improvement comprises a pair of micro computers (MR1, MR2) each having at least one data line (DL1, DL2) upon which similar binary signals from two micro computers (MR1, MR2) appear, a common pulse current supply (TG) connected to said micro computers, a pair of first pulse-edge triggered D-type flip-flops (K1, K10) respectively connected to receive on their D input terminals outputs of said micro computers and with their (Q) outputs connected to the reset inputs (R) of a second pair of pulse-edge triggered D-type flip-flops (K2, K20), and the input of said amplifier connected to the Q or $\bar{Q}$ outputs of one of said second pair of trigger circuit elements (K2, K20), synchronous clock pulses supplied from said pulse current supply (TG) to the C-inputs of said second pair of trigger circuit elements (K2, K20), the reset inputs (R) of said first pair trigger circuit elements (K1, K10) connected to an output of the pulse current supply (TG) which output delivers a reset signal (GL1, GL2, respectively), the D inputs of said second pair of flip-flops connected, respectively, to their Q outputs, a non-equivalent monitoring element (AD) which receives interrogation test pulses (TS) from said pulse current supply (TG), said monitoring element (AD) connected to the negated output $\overline{Q}$ of one of said second pair of trigger circuit elements (K2) and to the Q output of the other of said second pair of trigger circuit elements (K20), and said non-equivalent monitoring element (AD) producing output test pulses (TS) in the case of static as well as in the case of dynamic non-equivalent signals for the purpose of maintaining the pulse current supply (TG) in the on state.

2. A safety circuit according to claim 1 wherein said amplifier is a push-pull amplifier, including two amplifiers, an output transformer with its primary winding connected to said two amplifiers, one of said amplifiers (V1) connected to the negated (Q) output of said one of said second pair of trigger circuit elements (K2) and the second amplifier (V2) connected to the Q output of the other one of said second pair of trigger circuit elements (K20).

3. A safety circuit according to claim 2 wherein said first and second pairs of trigger circuit elements are D trigger circuit elements (K1, K10, K2, K20) and where one of the respective second pair of D trigger circuit elements (K2, K20) has its D input connected to its negated Q output.

4. A safety circuit according to claim 1 wherein said non-equivalent-monitoring element (AD) consists of an electronic switching amplifiers (TR), having a current supply and a rectifier circuit (D1, D2 D3, D4) which receives the signals to be monitored from said second pair of trigger circuit elements.

5. A safety circuit according to claim 4 wherein said switching amplifier is a transistor.

* * * * *